(12) United States Patent
Sukegawa et al.

(10) Patent No.: US 7,834,316 B2
(45) Date of Patent: Nov. 16, 2010

(54) METHOD FOR ADJUSTING IMAGING MAGNIFICATION AND CHARGED PARTICLE BEAM APPARATUS

(75) Inventors: Shigeki Sukegawa, Hitachinaka (JP); Shunsuke Koshihara, Hitachinaka (JP); Kyoungmo Yang, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 428 days.

(21) Appl. No.: 12/043,942

(22) Filed: Mar. 6, 2008

(65) Prior Publication Data

US 2008/0217529 A1 Sep. 11, 2008

(30) Foreign Application Priority Data

Mar. 9, 2007 (JP) .............................. 2007-059357

(51) Int. Cl.
*G06K 9/48* (2006.01)
(52) U.S. Cl. ......................... 250/307; 250/306; 382/145
(58) Field of Classification Search .................. 250/307
See application file for complete search history.

(56) References Cited

U.S. PATENT DOCUMENTS 5,546,225 A * 8/1996 Shiraishi ..................... 359/559
6,868,175 B1 * 3/2005 Yamamoto et al. .......... 382/145
7,559,047 B2 * 7/2009 Miyamoto et al. ............ 716/21

FOREIGN PATENT DOCUMENTS

| JP | 05-102259 A | 4/1993 |
|----|-------------|--------|
| JP | 2004-095657 A | 3/2004 |

* cited by examiner

*Primary Examiner*—David A. Vanore
*Assistant Examiner*—Phillip A. Johnston
(74) *Attorney, Agent, or Firm*—Miles & Stockbridge P.C.

(57) ABSTRACT

There is provided a method for setting a suitable imaging magnification for each of a plurality of measurement places in a charged particle beam apparatus which images a semiconductor pattern.

For a given measuring point coordinate, a line segment or a vertex representing a change in concavity and convexity near the measuring point coordinate is searched, and an imaging magnification is set so that coordinates on a sample corresponding to both ends which gives a length that serves as a reference falls in a field of view of the charged particle beam apparatus by letting a minimum distance be the reference, of distances between line segments representing a change in concavity and convexity from the measuring point coordinate or a distance between neighboring vertexes.

5 Claims, 8 Drawing Sheets

METHOD FOR ADJUSTING IMAGING MAGNIFICATION AND CHARGED PARTICLE BEAM APPARATUS

BACKGROUND OF THE INVENTION

1. Field of the Invention

The present invention relates to a semiconductor inspection apparatus and a semiconductor inspection method and, more particularly, relates to a method for adjusting an imaging magnification of an inspection apparatus which takes an image of a structure on a semiconductor wafer and analyzes it.

2. Description of the Related Art

A charged particle beam apparatus such as a scanning electron microscope is a device suitable for measuring and observing patterns formed on a semiconductor wafer whose miniaturization has been advancing. In the case where the patterns formed on the semiconductor wafer are measured or observed, inspection by the charged particle beam apparatus is automatically and continuously performed. However, imaging conditions, image processing conditions, and inspection conditions such as inspection items, which are for observing and measuring, need to be manually set by an operator. For example, a measurement magnification for a measurement point or a length measurement point is judged and determined by the operator so that a pattern is entered in a field of view and a range for length measuring can be specified. In such a method, however, all of the measurement points or the length measurement points in a recipe need to be checked and determined one by one by the operator.

On the other hand, Japanese Patent Application Laid-Open No. 5-102259 discloses a secondary electron image magnification setting means for setting a secondary electron image magnification into an electron beam device so that the number of wirings n in a region corresponding to a field of view of the secondary electron image falls in a certain range on the basis of design data of wiring patterns.

Japanese Patent Application Laid-Open No. 2004-95657 discloses that it is possible to estimate an inspection object size and determine a magnification for photographing the inspection object by specifying an inspection position and an inspection item by means of design data.

In the Cited Document 1, the magnification is calculated by the number of wirings included in a layout drawing based on the design data. However, in a situation where recent design data is complicated, wirings which can be counted up are not necessarily present at a place to be desirably measured. Furthermore, the magnification is determined so that the number of wirings n falls within a range of $n_1 \leq n \leq n_2$ in determining the magnification; however, there is not disclosed how $n_1$ and $n_2$ are determined.

In the Cited Document 2, the imaging magnification cannot be specified unless a line width, a space width, a pitch width, and the like are preliminarily specified as inspection items. In such a method, it is very troublesome because pattern shapes (line, hole, and the like) and measurement portions (line width, hole size, and the like) to be measured need to be preliminarily set with respect to very many inspection positions.

SUMMARY OF THE INVENTION

The present invention is to provide a method for setting a suitable imaging magnification for each measurement point by means of a simple technique using design data.

For a given measuring point coordinate, a portion or a vertex where there is a change in concavity and convexity near the measuring point coordinate is searched, and an imaging magnification is set so that the minimum among distances from the measuring point coordinate to portions where there is a change in concavity and convexity or distances between neighboring vertexes falls in a field of view.

According to the method of the present invention, an imaging magnification can be determined by use of design data, without depending on a pattern shape.

DESCRIPTION OF REFERENCE NUMERALS

1 Control device
2 Optical system control device
3 Stage control device
4 Sample carrier control device
5 Sample exchange room control device
6 Wafer cassette
7 Wafer
8 Carrying robot
9 Load lock chamber (sample exchange room)
10,11 Gate valve
12 Sample room
13 Stage
14 High voltage control device
15 Condenser lens control unit
16 Amplifier
17 Deflection signal control unit
18 Objective lens control unit
19 Extraction electrode
20 Electron source
21 Electron beam
22 Condenser lens
23 Objective lens 24 Deflector
25, 28 Secondary electron
26 Display device
27 Secondary electron conversion electrode
29 Secondary electron detector
30 Measuring point coordinate
31 Line segment shown in layout drawing (portion where there is change in conavity and convexity)
32 Distance Dx between coordinates of portions where there is change in conavity and convexity (X direction)
33 Distance Dy between coordinates of portions where there is change in conavity and convexity (Y direction)
34 Vertex of nearest neighboring wiring pattern from measuring point coordinate
35 Distance between nearest neighboring vertexes
36 Foot of perpendicular drawn down to edge shown in layout drawing
37 Distance between foot coordinate of perpendicular and vertex of wiring pattern
38 Distance between coordinates along edges shown in layout drawing (long axis direction)
39 Distance between coordinates along edges shown in layout drawing (short axis direction)

DESCRIPTION OF THE PREFERRED EMBODIMENTS

The following embodiments will be described using a critical dimension scanning electron microscope (CD-SEM) that is one of semiconductor inspection apparatuses. In addition, the present invention can be applied to a semiconductor inspection apparatus other than the CD-SEM.

Figure 1:
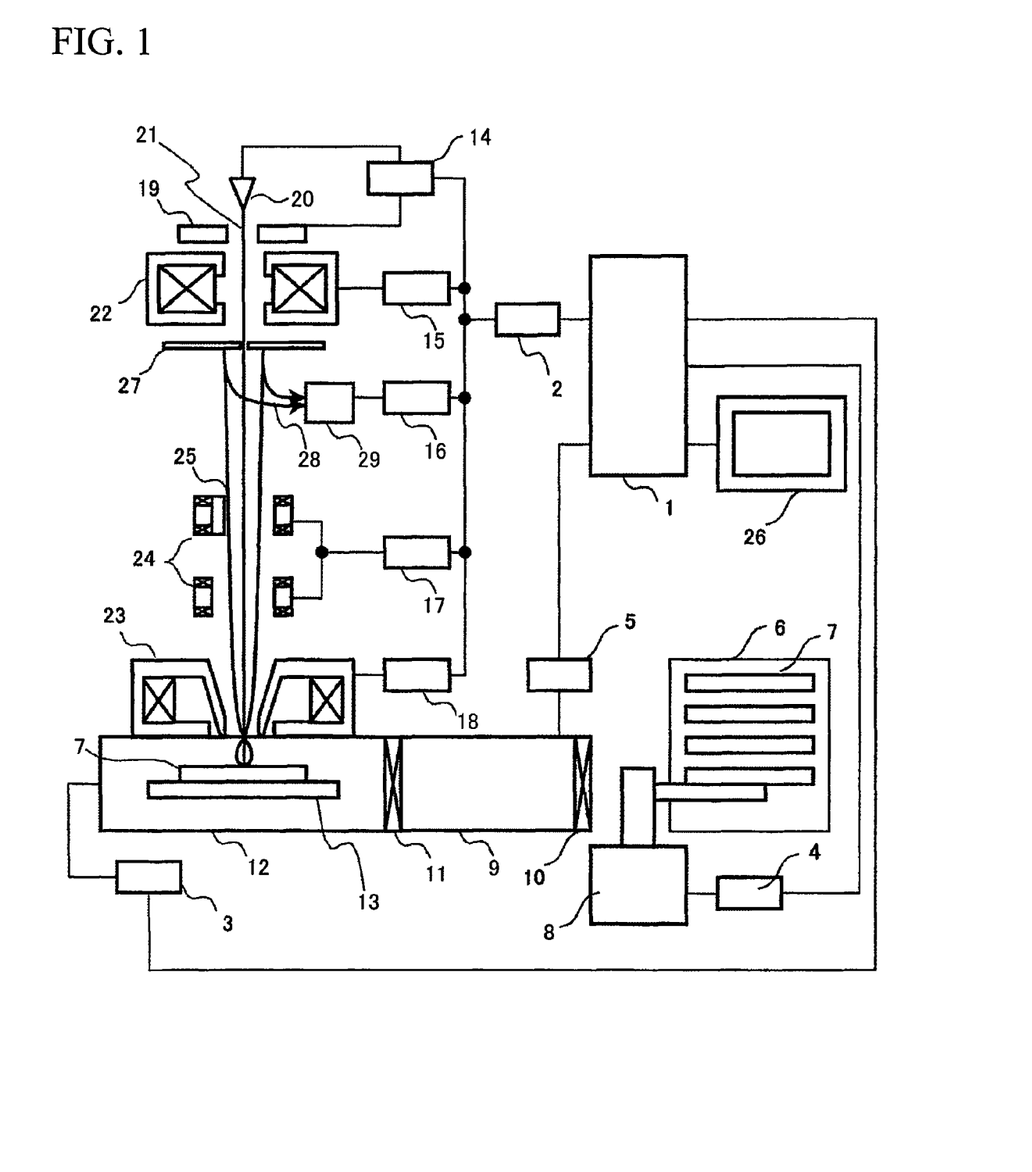
FIG. 1 shows a schematic diagram of a critical dimension scanning electron microscope (referred to as CD-SEM)

FIG. 1 is a schematic diagram of a CD-SEM. A control device 1 controls an optical system control device 2, a stage control device 3, a sample carrier control device 4, and a sample exchange room control device 5 on the basis of an accelerating voltage, sample (semiconductor device) information, measurement position information, wafer cassette information, and the like, which are inputted by an operator from a user interface (not shown in the drawing).

The sample carrier control device 4 which is commanded from the control device 1 controls a carrying robot 8 so that any wafer 7 is moved from a wafer cassette 6 to a predetermined position in a load lock chamber 9 (sample exchange room). The sample exchange room control device 5 controls so as to open and close gate valves 10 and 11 in conjunction with entry and exit of the wafer 7 to and from the load lock chamber 9. Further, the sample exchange room control device 5 controls a vacuum pump (not shown in the drawing) which vacuumizes the load lock chamber 9, and forms a vacuum equivalent to that in a sample room 12, in the sample exchange room 9 when the gate valve 11 is opened. The wafer 7 entered in the sample exchange room 9 is sent to the sample room 12 via the gate valve 11 and fixed on a stage 13. The load lock chamber 9 and the sample room 12 are formed in order to enclose the sample in a vacuum region.

The optical system control device 2 controls a high voltage control device 14, a condenser lens control unit 15, an amplifier 16, a deflection signal control unit 17, and an objective lens control unit 18 in accordance with commands from the control device 1.

An electron beam 21 extracted from an electron source 20 by an extraction electrode 19 is focused by a condenser lens 22 and an objective lens 23, and irradiated to the wafer 7 disposed on the sample stage 13. The electron beam 21 is one-dimensionally or two-dimensionally scanned on the wafer 7 by a deflector 24 which has received a signal from the deflection signal control unit 17.

A secondary electron 25 emitted from the wafer due to the irradiation of the electron beam 21 to the wafer 7 is converted to a secondary electron 28 by a secondary electron conversion electrode 27; and the secondary electron 28 is captured by a secondary electron detector 29 and used as a luminance signal of a display screen of a display device 26 via the amplifier 16.

Furthermore, a pattern shape on the wafer can be reconstructed on the display device 26 by synchronizing a deflection signal of the display device 26 with a deflection signal of the deflector 24.

In such a scanning electron microscope, determination of an imaging magnification of a sample (semiconductor device) was conventionally made by an operator. In setting the imaging magnification, an appropriate magnification was judged and determined for each of the existing several hundreds to several thousands of measurement points or length measurement points; and therefore, it was very troublesome. The present invention is to provide a method for setting a suitable imaging magnification by means of a simple technique using design data.

The design data is data representing a chip design, and usually data such as vertex coordinates of wirings are preserved.

The imaging magnification is determined using such design data.

First, a coordinate (referred to as measuring point coordinate hereinafter) representing a reference point of a measurement or length measurement position is obtained. There are various kinds of calculation methods of the measuring point coordinates. For example, there include the case where measuring point coordinates are preliminarily known because a measurement point or a length measurement point has been set when making a test pattern or the like, a method for automatically calculating coordinates which are considered to be a hazardous place using simulator tools, and the like.

Next, when the measurement point or the length measurement point is checked on design data, there exists a pattern structure around the measurement point or the length measurement point. A portion where there is a change in concavity and convexity of the pattern structure is used for determining the magnification.

Embodiment 1

A method for determining an imaging magnification by means of a position where there is a change in concavity and convexity near a measurement point or a length measurement point will be described using FIG. 2. The method is especially effective in the case where there is the measurement point or the length measurement point in a closed graphic.

Figure 2:
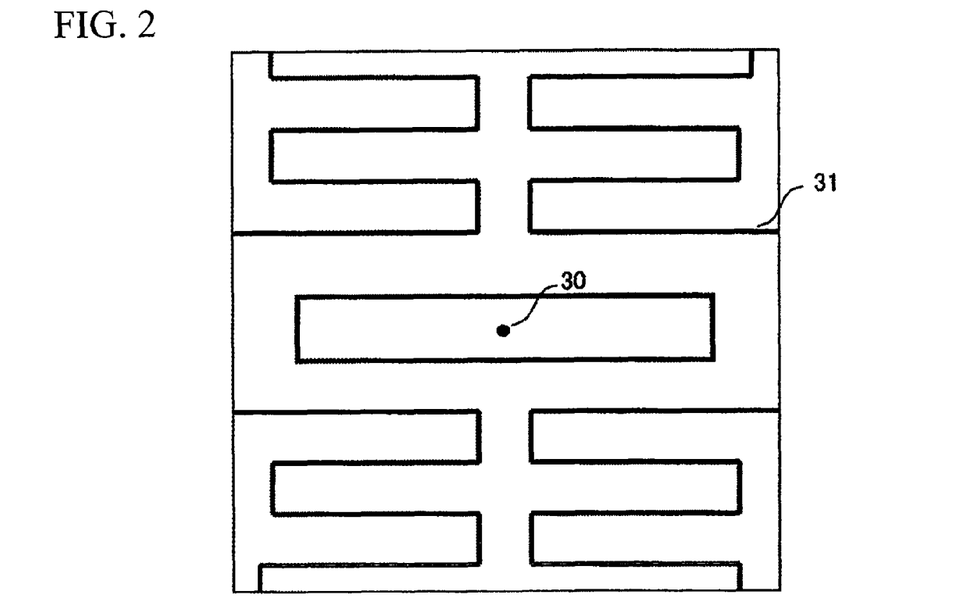
FIG. 2 shows a layout drawing of design data and a measuring point coordinate (in the case where a measuring point is present in a closed graphic)

FIG. 2 shows a layout drawing of general design data and a measuring point coordinate of the measurement point or the length measurement point. In addition, FIG. 2 is the layout drawing of design data showing a position where there is a change in concavity and convexity. The layout drawing shows sets of line segments connecting coordinates of pattern vertexes on the basis of the design data, and each line segment shows a portion where there is a change in concavity and convexity of a semiconductor sample pattern. Coordinates of portions where there is a change in concavity and convexity of the design data only need to be calculated for obtaining the following coordinates, and making of the layout drawing is not necessarily required.

First, a portion where there is a change in concavity and convexity of a pattern is searched from the measuring point coordinate in positive and negative directions in an X direction and positive and negative directions in a Y direction. Coordinates of portions where there is a change in concavity and convexity of a pattern, that is, in the case of FIG. 3, foot coordinates of perpendiculars drawn down to line segments shown in the layout drawing from the measuring point coordinate are obtained. Next, by use of these coordinates, a line segment distance between the coordinates is obtained for each of the X direction and the Y direction. Let the distance for the X direction be a distance Dx, and let the distance for the Y direction be a distance Dy. Then, Dx and Dy are compared, and let the smaller value be a reference for magnification determination. For example, in FIG. 3, since Dy is smaller than Dx, let Dy be the reference of the magnification determination.

The reason why let the shorter length be the reference of the magnification determination is that, an object to be measured by a CD-SEM is a line width of the semiconductor pattern. An important parameter exerting an influence on performance of transistors that are final products is a line width, and the CD-SEM takes the line width as a measurement object; and therefore, let the shorter length be the reference of the magnification determination.

Figure 3:
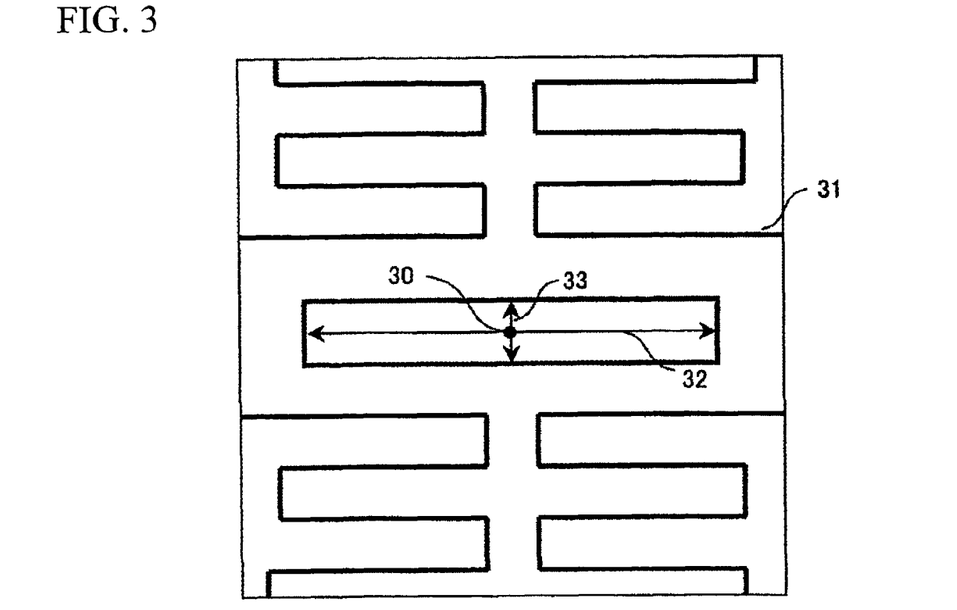
FIG. 3 shows length measurement between coordinates of portions where there are changes in concavity and convexity.

An imaging magnification of a semiconductor inspection apparatus is determined so that coordinates at both ends which give Dy that is the shorter length fall in a field of view.

The magnification obtained using the design data and a magnification of the CD-SEM are related; and if the magnification determined on the basis of the design data is inputted to the control device 1, it becomes possible to image by the inputted magnification.

Figure 4:
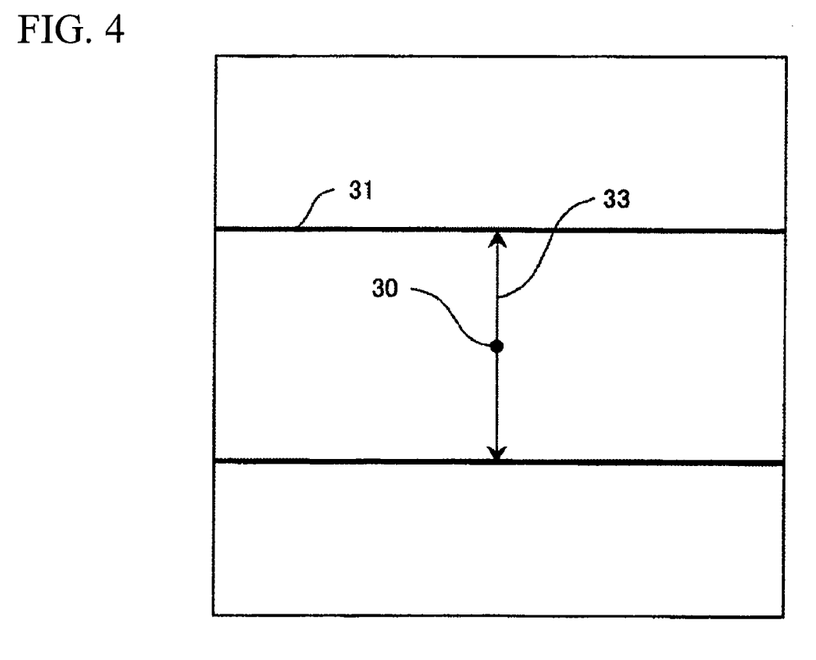
FIG. 4 shows a conceptual view of a result imaged by an imaging magnification which is determined on the basis of design data.

An image of the semiconductor pattern obtained by the magnification which is determined by such method is as shown in FIG. 4.

Figure 5:
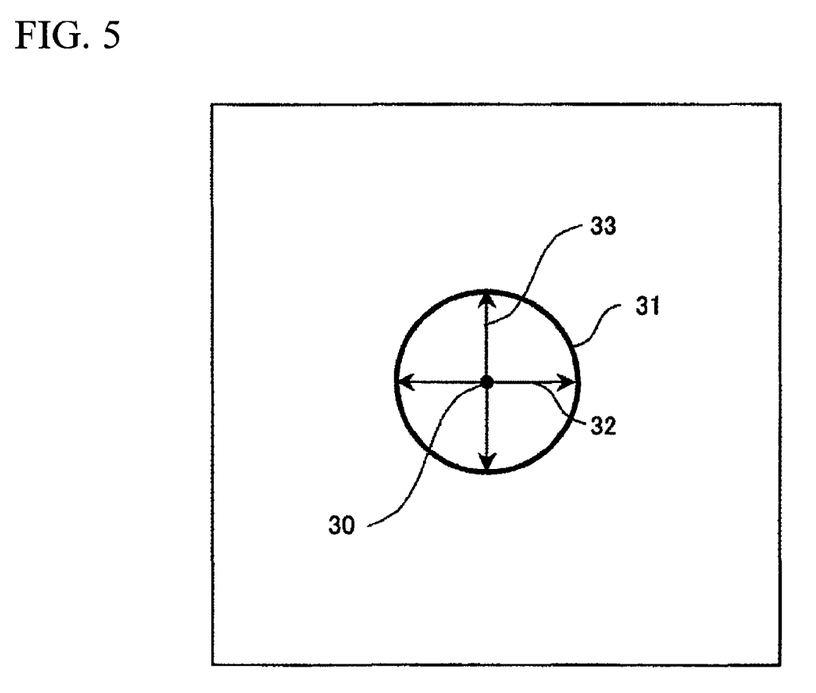
FIG. 5 shows a layout drawing of design data of a hole pattern.
Figure 6:
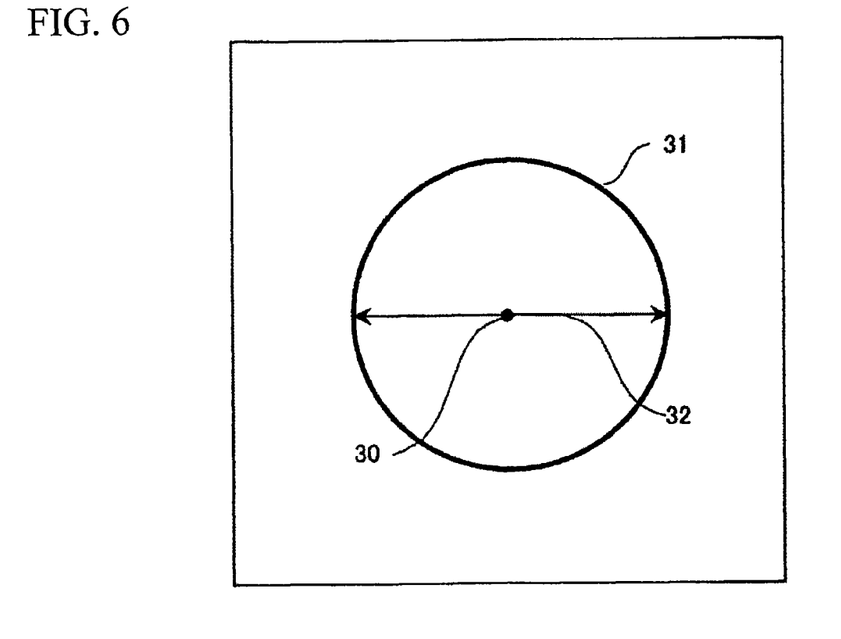
FIG. 6 shows a conceptual view of a result imaged by an imaging magnification which is determined on the basis of the design data of the hole pattern.

The description is made using a line pattern in the drawing; however, the same method can be used even for a hole pattern. Even when the measuring point coordinate is entered in a hole, portions where there is a change in concavity and convexity (circumferential portion in the case of the hole) with respect to the X direction and the Y direction is searched, and their distances are obtained. Further, the imaging magnification is determined by letting the shorter distance thereof be the reference of the magnification determination.

In addition, there is a case where there is not a change in concavity and convexity of a pattern. In such case, a corresponding length is taken as a length from the end to the end of design data, or infinite; and it may be compared to the other length.

Embodiment 2

A method for determining an imaging magnification by means of a pattern vertex near a measurement point or a length measurement point will be described using FIGS. 7 and 8. The method is especially effective in the case where the measurement point or the length measurement point does not lie in a closed graphic.

Figure 7:
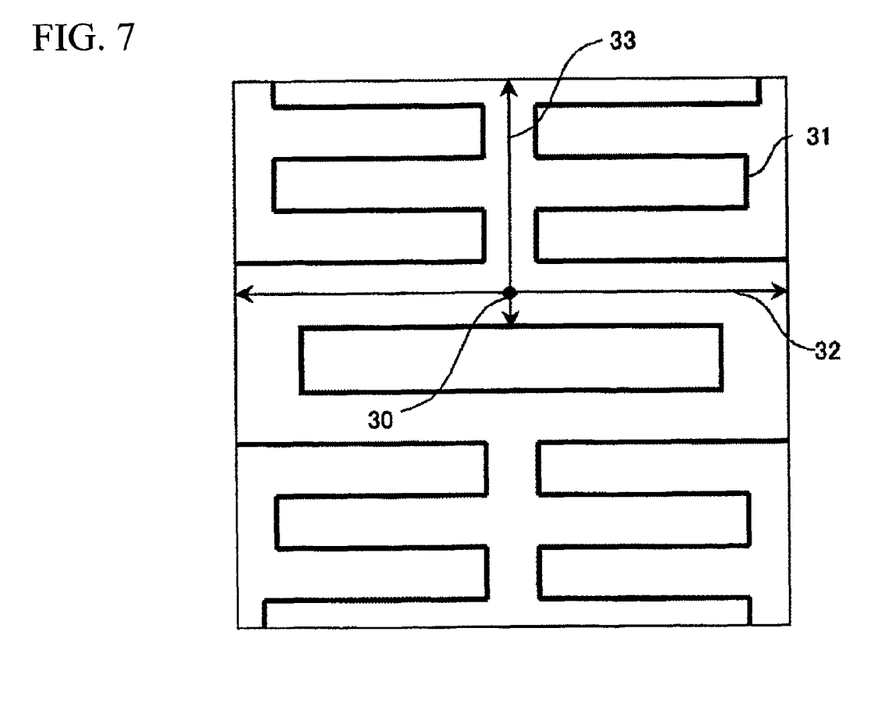
FIG. 7 shows a layout drawing of design data and a measuring point coordinate (in the case where a measuring point is not present in a closed graphic)
Figure 8:
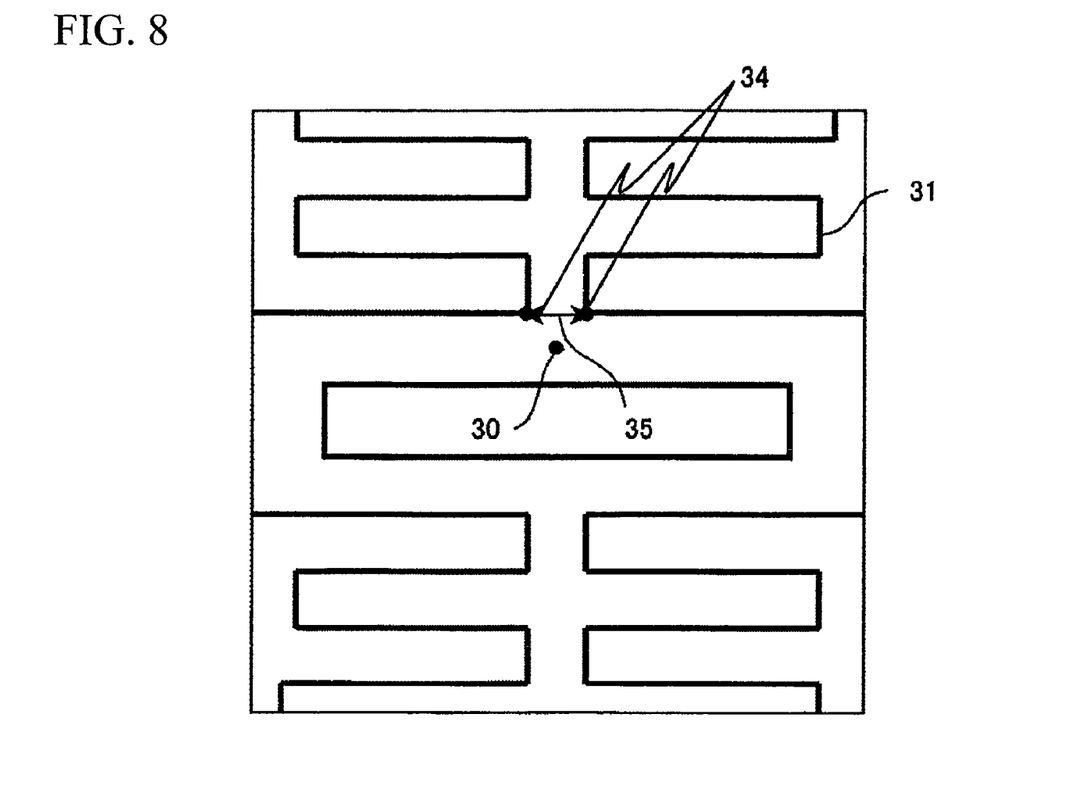
FIG. 8 shows a view of coordinates near the measuring point coordinate and a distance therebetween.

FIG. 7 shows a layout drawing of general design data and a measuring point coordinate of the measurement point or the length measurement point.

In the case where the measuring point coordinate does not lie in a closed graphic, even a portion where there is a change in concavity and convexity (line segment shown in the layout drawing) is searched along the coordinate system of design data, there exist no points corresponding to each other; and therefore, in the case where a magnification is determined by the method of Embodiment 1, there is a possibility that the magnification is not suitable for measurement.

In this case, the magnification is determined using vertex coordinates of patterns existing near the measuring point coordinate. First, two points of vertexes shown in the layout drawing existing near the measuring point coordinate are obtained. The imaging magnification is set so that the two points and the measuring point fall in a field of view.

The reason why such method is adopted is that if two vertexes near the measuring point coordinate and the measuring point coordinate are included in the field of view, a length to be measure by a CD-SEM is also included in the field of view.

Embodiment 3

Figure 9:
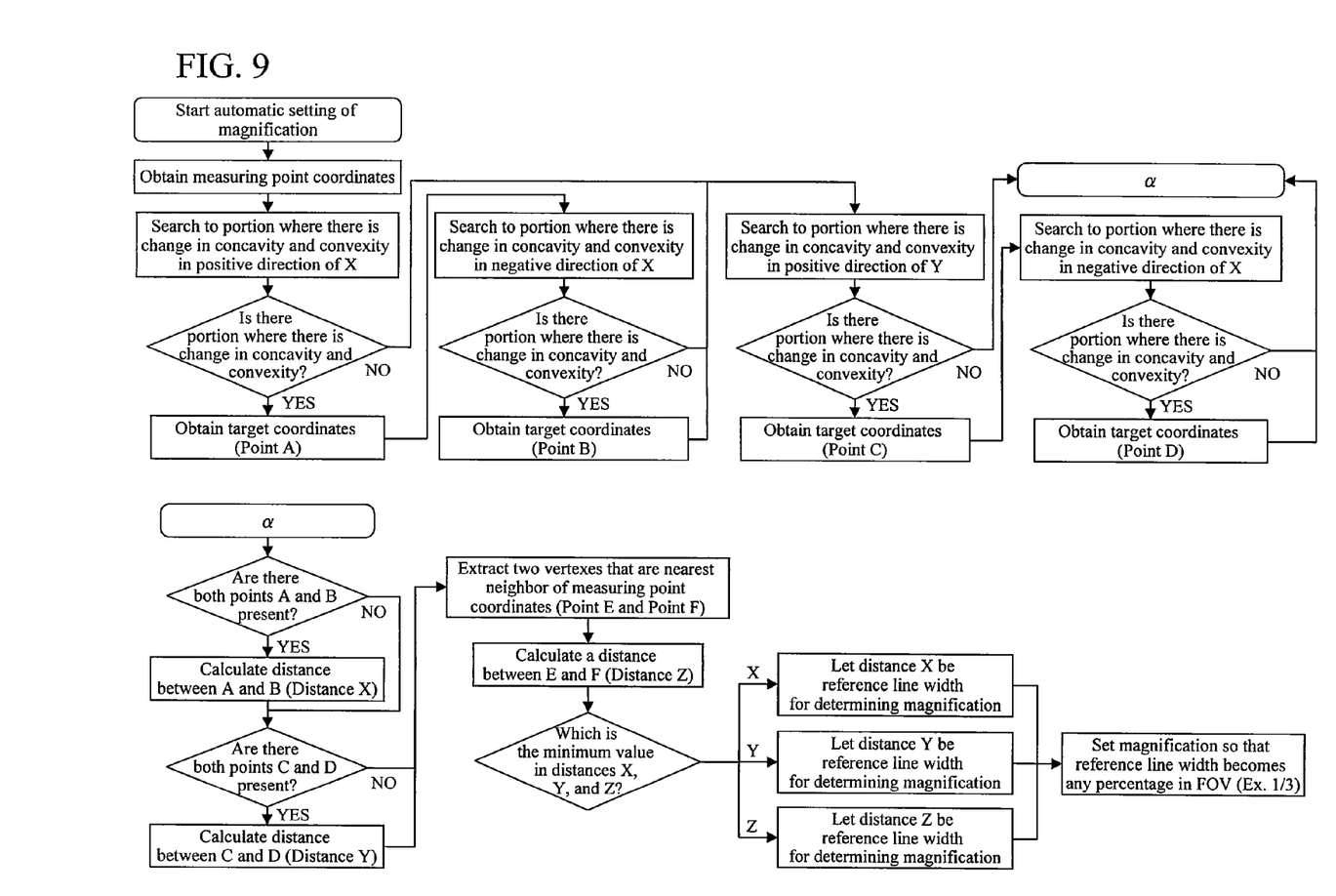
FIG. 9 shows a flow chart of a method of magnification determination.

There will be described one embodiment regarding usage of a method of magnification determination in the cases where a measurement point or a length measurement point is present in a closed graphic and is not present therein, using a flow chart shown in FIG. 9.

First, a coordinate of a portion where there is a change in concavity and convexity is obtained for each of the positive side and the negative side in the X direction from the measuring point coordinate. If the portion where there is the change in concavity and convexity is not present on design data, a process proceeds to the next step. Similarly, also in the Y direction, a coordinate of a portion where there is a change in concavity and convexity is obtained for each of the positive side and the negative side. If the portion where there is the change in concavity and convexity is not present on the design data, the process proceeds to the next step.

In the case where there exist both points A and B representing a change in concavity and convexity on the positive side and the negative side in the X direction, a distance Dx between the points A and B is obtained. In the case where one of the points A and B or either of points is not present, this step is omitted. Similarly, in the case where there exist both points C and D representing a change in concavity and convexity on the positive side and the negative side in the Y direction, a distance Dy between the points C and D is obtained. In the case where one of the points C and D or either of points are not present, this step is omitted.

Furthermore, nearest neighboring two vertexes from the measuring point coordinate are extracted. Let their coordinates be points E and F. A distance between the points E and F is obtained; and this is taken as Dz. Of Dx, Dy, and Dz, the minimum length one is taken as a reference, and an imaging magnification is determined so that the coordinates of both ends which give the minimum length and the measuring point coordinate fall in a field of view.

Embodiment 4

A method which is used by combining a method using a pattern edge (or side) near a measurement point or a length measurement point and a method using a vertex near it will be described.

Figure 10:
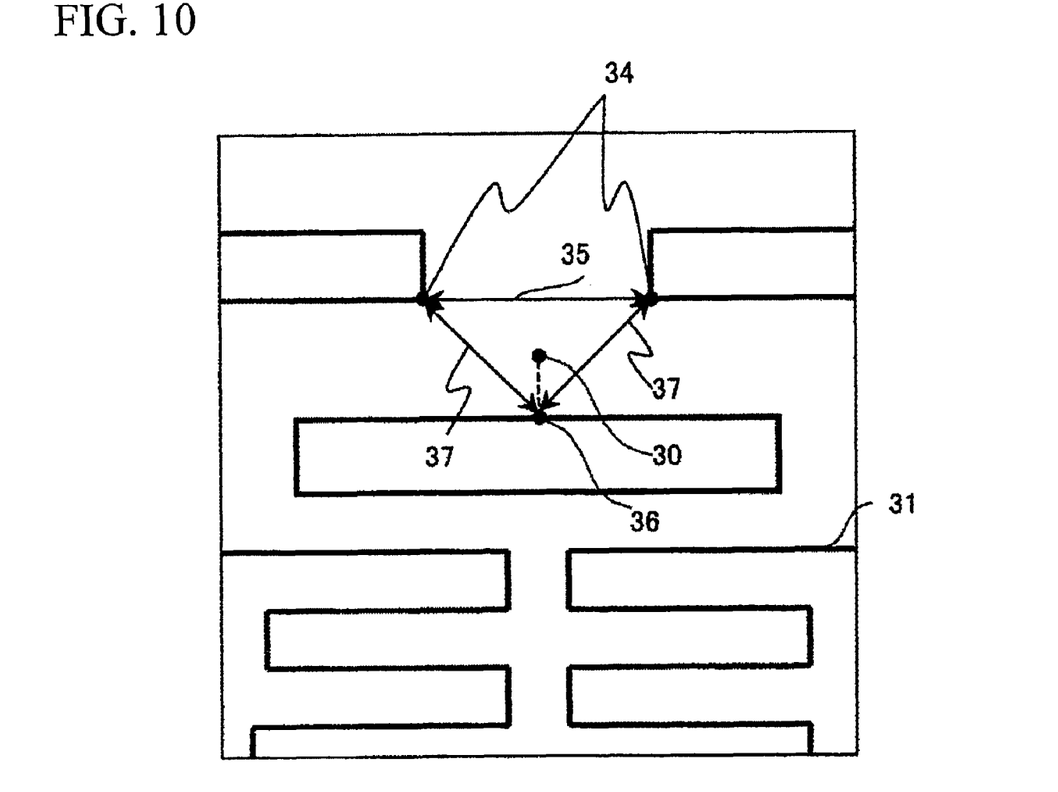
FIG. 10 shows a layout drawing of design data and a measuring point coordinate (in the case where a measuring point is not present in a closed graphic)

FIG. 10 shows a layout drawing of general design data and a measuring point coordinate of a measurement point or a length measurement point.

First, in the case where a pattern edge is used, foot coordinates of perpendiculars drawn down to the pattern edge from the measurement point or the length measurement point are obtained. Furthermore, coordinates of vertexes are obtained with respect to pattern vertex. Of the thus obtained coordinates, three points whose distances from the measuring point coordinate are the nearest are selected out. From the result that any two points of those three points are selected and distances therebetween are compared, a magnification is determined so that coordinates of both ends of a line segment which gives the shortest length and the measuring point coordinate fall in a field of view of a CD-SEM.

Embodiment 5

Figure 11:
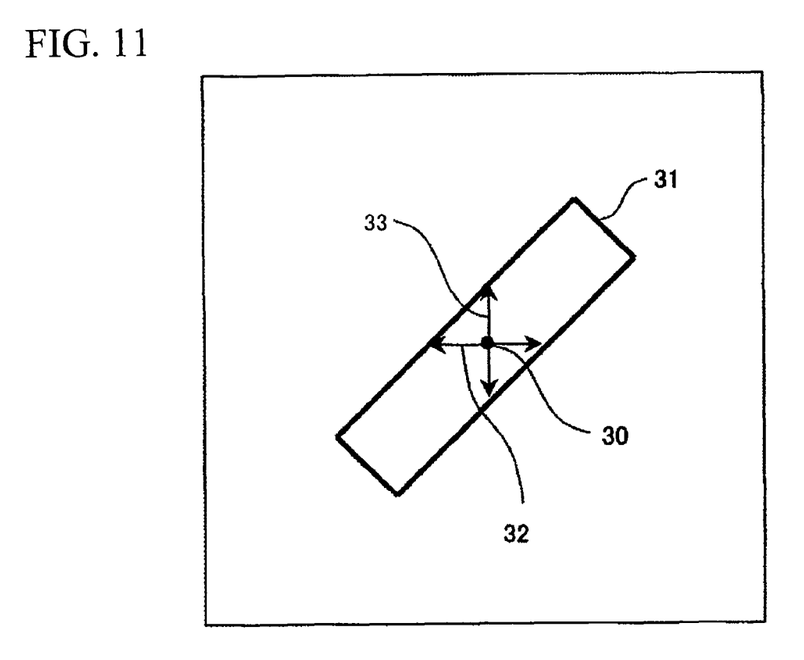
FIG. 11 shows a method for determining an imaging magnification in an oblique pattern.

A method of magnification determination in the case of an oblique pattern will be described. First, as in the Embodiment 1, a straight line is drawn along the coordinate system of design data, from the measuring point coordinate, and coordinates of intersections between that line and line segments shown in the layout drawing are obtained. Next, by use of their coordinates, a line segment distance between the coordinates in each of the X direction and the Y direction is obtained. The magnification is determined by letting the shorter length of the two line segments be a reference.

Figure 12:
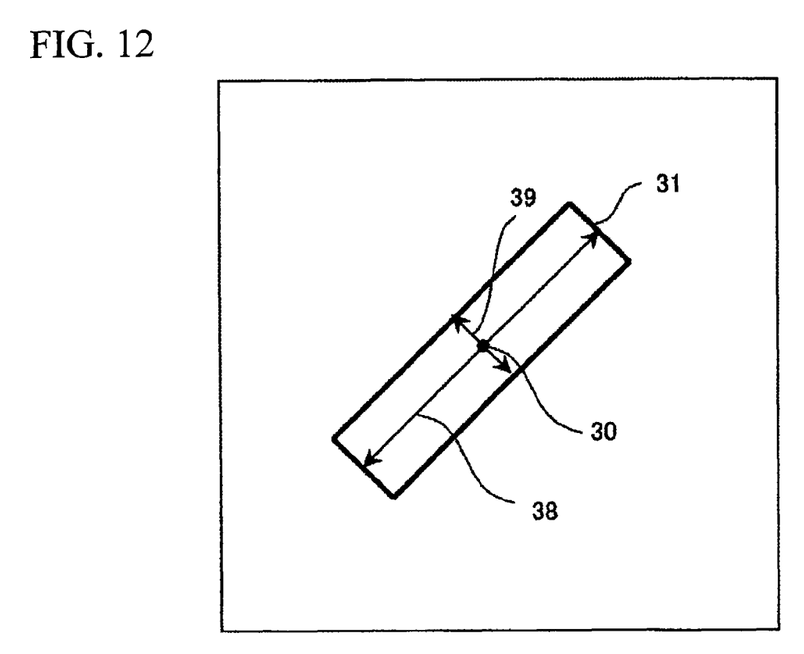
FIG. 12 shows a method for determining an imaging magnification in an oblique pattern.

Another embodiment with respect to an oblique pattern will be described. Coordinates of intersections between a straight line drawn from a length measurement point along a straight portion of a wiring pattern, but not along the coordinate system of the design data, and line segments shown in the layout drawing are obtained. FIG. 12 describes the obtaining method. A line segment distance between the coordinates is obtained using the coordinates of the intersections. Of the two line segments, the shorter length is taken as a reference, and the magnification is determined.

As described above, in the method of magnification determination along the straight portion of the wiring pattern, the direction of the straight portion of the wiring pattern agrees with a length measuring direction, and there is a merit in that a portion to be length measured surely falls in a field of view.

The method of magnification determination using the design data described in the above embodiment is possible even in a computer which is provided in a semiconductor inspection apparatus, and even using an external computer.

A method for determining a magnification of a SEM will be described in detail. The case where the length taken as the reference for determining the magnification falls in a field of view which can be imaged is described in the above embodiment. However, if it is too small with respect to a width of the field of view, that is, if the magnification is too low, there is a case where detection signal intensity (profile) for length measuring of a pattern cannot be correctly made. Furthermore, if the magnification is low, the length per a unit pixel is large; and therefore, length measurement cannot be accurately performed. In contrast, if the magnification is such a high one that the length taken as the reference is substantially equal to the width of the field of view, information at a hem portion of the detection signal intensity (profile) does not fall in the field of view; and therefore, it is inconvenient for the length measurement. Consequently, in order to solve the above problem, it is reasonable to set the magnification so that the length taken as the reference for magnification determination becomes approximately ½ to ¼ of the field of view.

What is claimed is:

1. A method for adjusting an imaging magnification of a semiconductor inspection apparatus, the method for adjusting the imaging magnification comprising the steps of:
    obtaining coordinates of a first point, a second point, a third point and a fourth point at which points a line segment representing a change in concavity and convexity in design data, first intersects
    a line segment drawn in a first direction from a reference point representing a portion to be measured by the semiconductor inspection apparatus,
    a line segment drawn in a second direction against said first direction,
    a line segment drawn in a third direction different from said first and said second directions, and
    a line segment drawn in a fourth direction against said third direction, respectively;
    obtaining lengths of a line segment between said first and said second points and a line segment between said third and said fourth points on the basis of said four coordinates; and
    setting an imaging magnification such that points on a semiconductor sample corresponding to both end points of the shorter line segment of said two line segments are included in a field of view imaged by the semiconductor inspection apparatus.

2. The method for adjusting an imaging magnification according to claim 1,
    wherein said first direction, said second direction, said third direction, and said fourth direction are parallel or perpendicular to coordinate system which said design data has.

3. The method for adjusting an imaging magnification according to claim 1,
    wherein said first direction, said second direction, said third direction, and said fourth direction are parallel or perpendicular to the line segment representing a change in concavity and convexity in said design data.

4. A method for adjusting an imaging magnification of a semiconductor inspection apparatus, the method for adjusting the imaging magnification comprising the steps of:
    selecting two points to which a distance from a reference point is the nearest of coordinates of pattern vertexes in design data, or foot coordinates of perpendiculars drawn down to a line segment representing a change in concavity and convexity in the design data from said reference point representing a portion to be measured by said semiconductor inspection apparatus; and
    setting an imaging magnification such that points on a semiconductor sample corresponding to the two points and said reference point are included in a field of view imaged by said semiconductor inspection apparatus.

5. A charged particle beam apparatus, comprising:
    a charged particle source;
    an objective lens which converges a charged particle beam emitted from said charged particle source on a sample; and
    a control device which controls said objective lens,
    wherein said control device, from a first point, a second point, a third point and a fourth point at which points a line segment representing a portion where there is a change in concavity and convexity of a pattern in design data first intersects
    a line segment drawn in a first direction from a reference point representing a portion to be measured by the semiconductor inspection apparatus,
    a line segment drawn in a second direction against said first direction,
    a line segment drawn in a third direction different from said first and said second directions, and
    a line segment drawn in a fourth direction against said third direction, respectively,
    sets an imaging magnification such that points on a semiconductor sample corresponding to both ends of the shorter line segment of a line segment between said first and said second points and a line segment between said third and said fourth points are included in a field of view imaged by the semiconductor inspection apparatus, and obtains a sample image.

* * * * *